US008767488B1

(12) United States Patent
Srinivasan et al.

(10) Patent No.: US 8,767,488 B1
(45) Date of Patent: Jul. 1, 2014

(54) CONTENT ADDRESSABLE MEMORY HAVING HALF-COLUMN REDUNDANCY

(75) Inventors: Varadarajan Srinivasan, Los Altos Hills, CA (US); Sandeep Khanna, Los Altos, CA (US); Bindiganavale S. Nataraj, Cupertino, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 359 days.

(21) Appl. No.: 13/301,419

(22) Filed: Nov. 21, 2011

(51) Int. Cl.
*G11C 15/00* (2006.01)
*G11C 15/04* (2006.01)
*G11C 29/00* (2006.01)
*G11C 29/24* (2006.01)

(52) U.S. Cl.
USPC ............. 365/200; 365/49.11; 365/49.17; 365/49.15; 365/49.16; 711/108; 714/710; 714/711

(58) Field of Classification Search
USPC ............... 365/200, 49.1, 49.11, 49.15, 49.16, 365/49.17; 711/108; 714/710, 711
See application file for complete search history.

(56) References Cited

U.S. PATENT DOCUMENTS

| | | | |
|---|---|---|---|
| 6,249,467 B1 | 6/2001 | Pereira et al. | |
| 6,275,426 B1 | 8/2001 | Srinivasan et al. | |
| 6,445,628 B1 | 9/2002 | Pereira et al. | |
| 6,657,878 B2 | 12/2003 | Lien et al. | |
| 6,714,430 B1 | 3/2004 | Srinivasan et al. | |
| 6,751,755 B1 | 6/2004 | Sywyk et al. | |
| 6,804,135 B1 | 10/2004 | Srinivasan et al. | |
| 6,865,098 B1 | 3/2005 | Ichiriu et al. | |
| 6,870,749 B1 | 3/2005 | Park et al. | |
| 7,016,243 B1 | 3/2006 | Srinivasan et al. | |
| 7,221,575 B1 | 5/2007 | Jiang | |
| 7,924,589 B1 | 4/2011 | Srinivasan et al. | |
| 2005/0024976 A1* | 2/2005 | Kang et al. ............ | 365/232 |

* cited by examiner

*Primary Examiner* — J. H. Hur

(74) *Attorney, Agent, or Firm* — Sterne, Kessler, Goldstein & Fox PLLC

(57) ABSTRACT

A method and apparatus for performing half-column redundancy in a CAM device is disclosed, capable of replacing a defective half-column in the CAM array with only one half of another column. For example, present embodiments can provide twice the redundancy by replacing only one half of a defective CAM cell with one half of a spare cell or of a selected cell. The half-column redundancy disclosed herein provides finer granularity and higher effectiveness to the redundancy scheme as compared to conventional redundancy schemes employed on a CAM array. Thus, the CAM array can be designed and fabricated with a higher yield without having to accommodate for more spare columns than employed by conventional redundancy schemes, allowing for more efficient use of silicon area and a more robust CAM array design.

28 Claims, 7 Drawing Sheets

US 8,767,488 B1

CONTENT ADDRESSABLE MEMORY HAVING HALF-COLUMN REDUNDANCY

TECHNICAL FIELD

The present embodiments generally relate to content addressable memory (CAM) devices, and more particularly to CAM devices having column redundancy techniques that allow for the selective replacement of half-columns of CAM cells.

BACKGROUND

Column redundancy can improve the yield of content addressable memory (CAM) devices. For example, a defective column of CAM cells can be replaced with a redundant column of CAM cells. It would be desirable to increase the granularity of column redundancy techniques in CAM devices to maximize yield and eliminate the discarding of usable portions of columns.

BRIEF DESCRIPTION OF THE DRAWINGS

Present embodiments are illustrated by way of example, and not by way of limitation, in the figures of the accompanying drawings and in which like reference numerals refer to similar elements and in which.

Like reference numerals refer to corresponding parts throughout the drawing figures.

DETAILED DESCRIPTION

A method and apparatus for performing half-column redundancy in a CAM device are disclosed. In the following description, numerous specific details are set forth in order to provide a thorough understanding of the present embodiments. However, it will be apparent to one skilled in the art that these specific details may not be required to practice the present embodiments. It is to be understood that the present embodiments are equally applicable to CAM structures of other sizes and configurations, as well as to other types of memory devices such as, for instance, RAM, Flash, Magnetic RAM (MRAM) and EEPROM. In other instances, well-known circuits and devices are shown in block diagram form to avoid obscuring the present embodiments unnecessarily. Additionally, the interconnection between circuit elements or blocks can be shown as buses or as single signal lines. Each of the buses can alternatively be a single signal line, and each of the single signal lines can alternatively be a bus. Further, the logic levels assigned to various signals in the description below are arbitrary, and therefore can be modified (e.g., reversed polarity) as desired. Accordingly, the present embodiments are not to be construed as limited to specific examples described herein but rather include within their scope all embodiments defined by the appended claims.

In accordance with the present embodiments, a CAM device is disclosed that includes a CAM array that can implement half-column redundancy techniques in which a defective half of a selected column of CAM cells can be functionally replaced by the other half of the selected column, by a selected half of another column, and/or by a selected half of a spare column. In this manner, the present embodiments achieve a finer level of granularity when replacing defective portions of columns of CAM cells than conventional approaches that replace an entire column of CAM cells with an entire column of spare CAM cells. Indeed, the ability to replace only the defective half of a column of CAM cells with another half-column of CAM cells not only provides improved redundancy but also increases the utilization and yield of the associated CAM device because usable portions of the column containing defects are not disabled.

Figure 1:
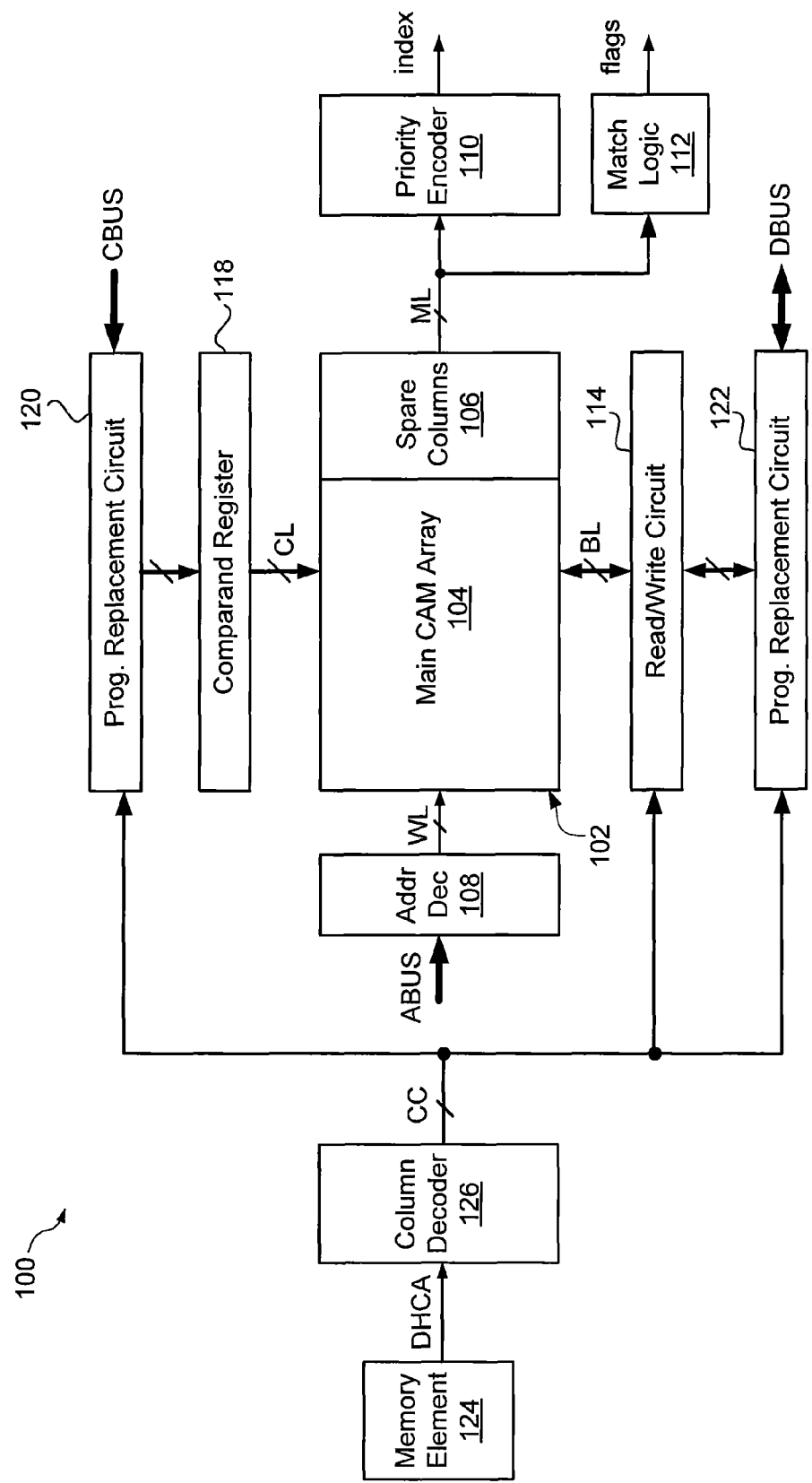
FIG. 1 is a block diagram of a CAM device in accordance with the present embodiments.

FIG. 1 is a block diagram of a CAM device 100 in accordance with the present embodiments. CAM device 100 includes a CAM array 102 that has a main CAM array 104 and one or more spare CAM columns 106. The spare CAM columns 106 are independent columns of CAM cells that can be enabled to functionally replace one or more half-columns of CAM cells in main CAM array 104. The CAM cells in main CAM array 104 and spare columns 106 can be any suitable type of CAM cells (e.g., binary, ternary, or quaternary CAM cells). For example, the CAM cells in main CAM array 104 and spare columns 106 are symmetrical about a vertical axis of the column. For purposes of discussion herein, the columns in main CAM array 104 are referred to herein as regular columns, and the CAM cells in the regular columns are referred to herein as regular CAM cells.

More specifically, for some embodiments, a "symmetrical" CAM cell is defined herein as a CAM cell having two memory cells oriented about a vertical axis and having a compare circuit that includes two associated match line pull-down stacks (e.g., two similar half-compare circuits) oriented about the vertical axis. In this manner, the symmetrical CAM cell can be logically divided into two similar CAM half-cells that can operate independently of each other, for example, as described in more detail below with respect to FIGS. 3A and 3B.

One or more instructions and related control signals can be provided to CAM device 100 from an instruction decoder (not shown for simplicity) to control read, write, and compare operations for CAM device 100. Other well-known signals that can be provided to CAM device 100, such as enable signals, reset signals, and clock signals, are not shown for simplicity.

Each row of CAM cells in array 102 is coupled to an address decoder 108 via a corresponding word line WL, and to a priority encoder 110 and to match logic 112 via a corresponding match line ML. The word lines WL and match lines ML are represented collectively in FIG. 1 for simplicity. For one embodiment, address decoder 108 receives addresses from an address bus ABUS. For other embodiments, address decoder 108 receives addresses from another bus. The match lines ML provide match results of compare operations to priority encoder 110, which determines the matching entry that has the highest priority number associated with it and generates the index or address of this highest priority match. Match logic 112 can generate a match flag to indicate a match condition, and can generate a multiple match flag to indicate multiple matches.

Further, although not shown in FIG. 1 for simplicity, each row of CAM cells in CAM array 102 can have one or more validity bits to indicate whether the corresponding row (or segment thereof) of CAM cells stores valid data. Match logic 112 can monitor the state of the validity bits and assert a full flag when all of the rows of CAM cells in CAM array 102 are filled with valid entries. The validity bits can also be provided to priority encoder 110 to generate the next free address (NFA) that is available in CAM array 102 for storing new data.

Each column of CAM cells in main array 104 and spare columns 106 is coupled to a read/write circuit 114 via a corresponding pair of bit lines BL, and is coupled to a comparand register 118 via a corresponding pair of comparand lines CL. The bit lines BL and comparand lines CL are represented collectively in FIG. 1 for simplicity. Comparand words (e.g., search keys) can be provided to comparand register 118 from a comparand bus CBUS by a programmable replacement circuit 120. Read/write circuit 114 includes well-known write drivers and sense amplifiers, and is coupled to a data bus DBUS by a programmable replacement circuit 122.

Programmable replacement circuits 120 and 122 can be any well-known switching logic such as, for example, a crossbar logic circuit, a switch matrix, translation logic, data filter, or mapping circuit that selectively steers data to and from selected half-columns of CAM array 102 in response to one or more column control (CC) signals provided, for example, by a column address decoder 126. More specifically, programmable replacement circuits 120 and/or 122 can be used to steer read data, write data, and comparand data (e.g., bits or groups of bits) originally associated with one half-column of CAM array 102 to another half-column of CAM array 102 to functionally replace one half-column of CAM array 102 with another half-column of CAM array 102. For other embodiments, programmable replacement circuits 120 and 122 can be the same circuit, and CBUS and DBUS can be the same bus.

One or more portions of spare columns 106 can be programmed to replace half-columns of CAM cells in main CAM array 104 as follows. Initially, main CAM array 104 is tested using any generally known testing methodology and/or hardware to determine if any columns in main CAM array 104 contain defects. Then, for each column that is found to contain defects, if all such defects are located in the same half of the column (e.g., indicating that all such defects are located in the same halves of the CAM cells within the column), then the defective half-column can be functionally replaced by another half-column in the CAM array 102. More specifically, if all the defects found in a selected column are located within the same half of the selected column, then that half-column is deemed to be a defective half-column, and the address of the defective half-column of CAM cells is programmed as a defective half-column address (DHCA) into a memory element 124. Memory element 124 can be any suitable non-volatile storage device or element including, for example, PROM, EEPROM, flash memory, and/or fuses. For other embodiments, memory element 124 can be eliminated, and the defective half-column address can be stored in a suitable external memory device and provided to CAM device 100 during initialization or reset.

When programmed, memory element 124 outputs the defective half-column address (DHCA) to column address decoder 126, which can be any suitable type of address decoder. Column address decoder 126 decodes the DHCA to generate a plurality of column control (CC) signals, which are provided to programmable replacement circuit 120, to programmable replacement circuit 122, and to read/write circuit 114. For the present embodiments, each CC signal indicates whether a corresponding column in main CAM array 104 contains defects, and if so, which half (or halves) of the corresponding column is deemed to be defective. For other embodiments, the DHCA can be stored in memory element 124 as a fully decoded signal set CC, and column decoder 126 can be eliminated.

For exemplary embodiments described herein, the DHCA can be expressed in the format DCA.H, where DCA is a binary number or address indicating which column in main CAM array 104 contains defects, and H is a bit indicating which half of the column contains the defects. For some embodiments, a de-asserted (e.g., logic 0) H bit indicates that the first or left half of the column contains the defects, and an asserted (e.g., logic 1) H bit indicates that the second or right half of the column contains the defects. For example, a DHCA of "000010.0" indicates that the third column (indicated by DCA=000010) contains defects, and that the left half (indicated by H=0) of that column is defective. For other embodiments, the DHCA can include separate values that identify the column containing defects and which half of that column is defective. Indeed, a person of ordinary skill in the art will understand that any addressing representation that indicates which half of a particular column of CAM cells contains defects can be used as the DHCA for the present embodiments.

In response to the CC signals, programmable replacement circuits 120 and 122 shift data access for the defective half-column and all subsequent (e.g., higher addressed or right-most) columns of CAM cells in main CAM array 104 by one half-column. Thus, for write operations, programmable replacement circuit 122 shifts data originally intended to be stored in the defective half-column and all subsequent columns of CAM cells by one-half-column to the right. For read operations, programmable replacement circuit 122 shifts the data received from all columns subsequent to the defective half-column of CAM cells back by one half-column to the left. For compare operations, programmable replacement circuit 120 steers comparand data to CAM array 102 by shifting the comparand data bits for the defective half-column and all subsequent columns of CAM cells by one half-column to the right. In this manner, the programmable replacement circuits 120 and 122 can functionally replace the defective half-column and all subsequent half-columns with corresponding adjacent half-columns, where the last half-column of main CAM array 104 is functionally replaced with a half-column of spare CAM cells 106. For other embodiments, the defective half-column can be functionally replaced by a selected half of the spare column 106 so that only data corresponding to the defective half-column is steered away from its intended location (e.g., to the selected half of the spare column 106).

Figure 2:
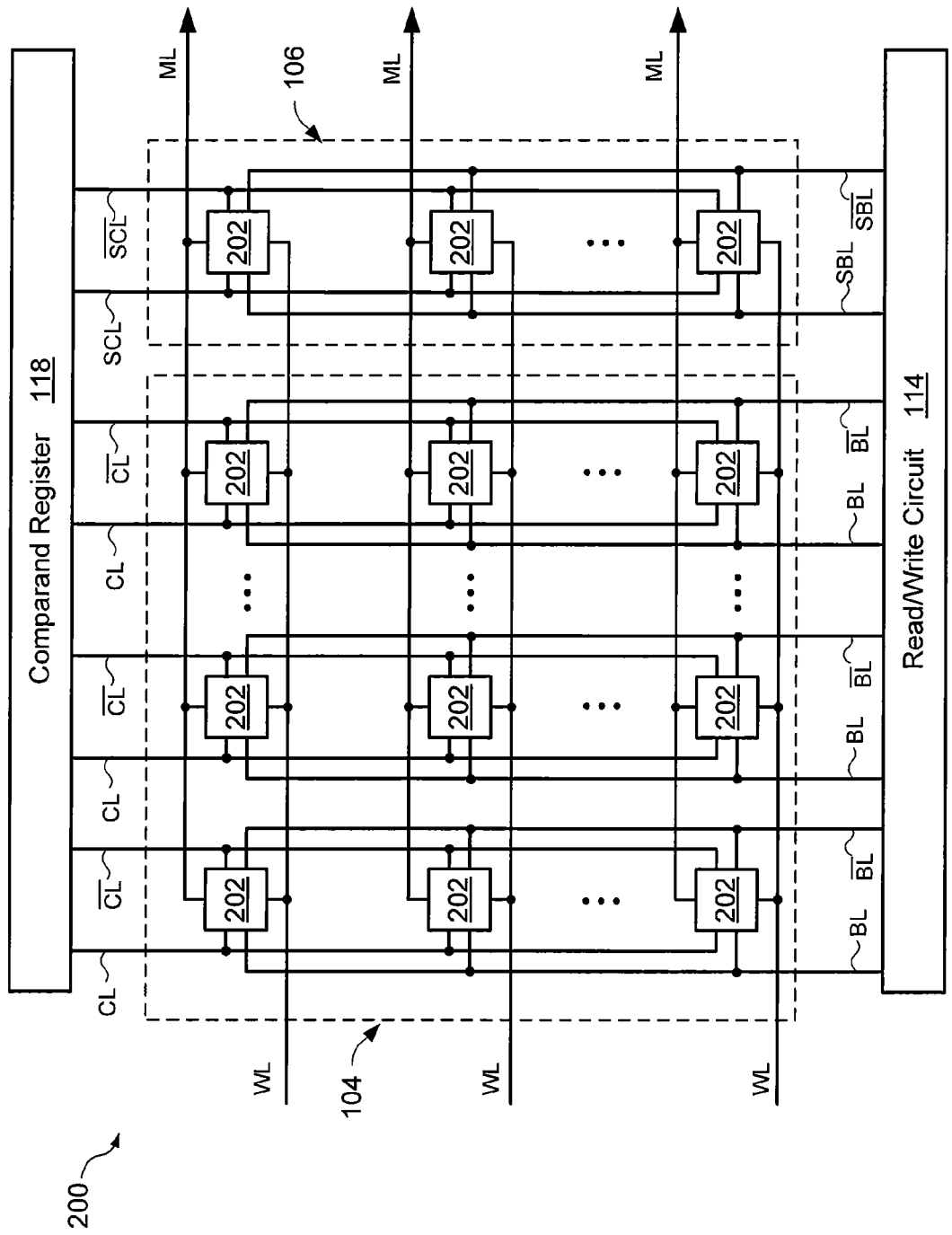
FIG. 2 is a block diagram of one embodiment of the CAM array of FIG. 1.

FIG. 2 shows a CAM array 200 that is one embodiment of CAM array 102 of FIG. 1. CAM array 200 includes main CAM array 104 having a plurality of CAM cells 202 organized in any number of rows and columns, and includes spare column 106 having a number of spare CAM cells 202. CAM cells 202 can be any suitable type of CAM cell that is symmetrical about a vertical axis of the columns of array 200. For simplicity, only one spare column 106 is shown in FIG. 2, although in other embodiments, spare column 106 can include any number of spare columns of CAM cells 202. While FIG. 2 shows the spare column 106 on the right of the main CAM array 104, the spare column 106 could alternatively be located on the left of the main CAM array 104, in which case the directions in which data is shifted as described below are reversed.

Each row of CAM cells 202 is coupled to a match line ML and to a word line WL. Referring also to FIG. 1, each word line WL is driven by address decoder 108 to select one or more rows of CAM cells 202 for writing or reading, and each match line ML provides the match results of a compare operation to priority encoder 110 and to match logic 112. A match line ML indicates a match condition for the row only if all CAM cells 202 in that row match the comparand data. In some embodiments, the match lines ML are pre-charged (e.g., to logic high) for the compare operation. Thereafter, if the data stored in one or more CAM cells 202 in a particular row does not match corresponding bits of the search key, then those one or more CAM cells 202 discharge the row's match line ML low (e.g., toward ground potential) to indicate the mismatch condition. Conversely, if the data stored in all CAM cells 202 of a particular row match corresponding bits of the search key, then the row's match line ML remains in its charged (e.g., logic high) state to indicate the match condition.

Each column of CAM cells 202 in main CAM array 104 is coupled to a complementary bit line pair BL and $\overline{BL}$ and to a complementary comparand line pair CL and $\overline{CL}$. Spare column 106 of CAM cells 202 is coupled to a complementary spare bit line pair SBL and $\overline{SBL}$ and to a complementary spare comparand line pair SCL and $\overline{SCL}$. The bit line pairs BL and $\overline{BL}$ and spare bit line pairs SBL and $\overline{SBL}$ are each coupled to read/write circuit 114. Read/write circuit 114 includes write drivers or buffers to provide data to selected bit line pairs BL and $\overline{BL}$ and/or to spare bit line pairs SBL and $\overline{SBL}$ during write operations, and includes sense amplifiers to read data output from CAM cells 202 onto selected bit line pairs BL and $\overline{BL}$ and/or spare bit line pairs SBL and $\overline{SBL}$ during read operations.

The comparand line pairs CL and $\overline{CL}$ and the spare comparand line pair SCL and $\overline{SCL}$ are each coupled to comparand register 118. Comparand register 118 drives the comparand word or search key onto selected comparand line pairs CL and $\overline{CL}$ and/or spare comparand line pairs SCL and/or $\overline{SCL}$ for comparison with data stored in CAM cells 202 during compare operations.

For alternate embodiments, other CAM array architectures can be used. For example, in some embodiments, complementary comparand lines CL and $\overline{CL}$ can be eliminated, in which case the complementary bit lines BL and $\overline{BL}$ can be coupled to comparand register 118 and be used to provide the search key to CAM array 200 during compare operations. Similarly, complementary spare comparand lines SCL and $\overline{SCL}$ can be eliminated, in which case the complementary spare bit lines SBL and $\overline{SBL}$ can be coupled to comparand register 118. In addition, although CAM array 200 is depicted as a NOR-based CAM array, for other embodiments, CAM array 200 can be a NAND-based CAM array.

Read, write, and compare operations are more fully described below with reference to FIGS. 1 and 2. For write operations, a data word is provided to programmable replacement circuit 122 via DBUS. If there is not a defective half-column in main CAM array 104, programmable replacement circuit 122 passes the data word unaltered to read/write circuit 114, which in turn drives the data word onto corresponding bit line pairs BL and $\overline{BL}$. The data is written to a row of main CAM array 104 selected by address decoder 108 in a well-known manner, for example, by asserting a word line WL in response to an externally provided address. Because there is not a defective half-column in main array 104, data is not written to any half of spare columns 106. For some embodiments, default data (e.g., such as the don't care state) can be written to the spare columns 106 to prevent CAM cells in the unused spare column 106 from participating in compare operations.

If there is a defective half-column in main CAM array 104, a DHCA is programmed into memory element 124 to indicate the location of the defective half-column. Column address decoder 126 decodes the DHCA to generate the CC signals, which in turn are used by programmable replacement circuit 122 to shift data corresponding to the defective half-column and all subsequent columns in main array 104 by one-half-column to the right during write operations, and to shift data corresponding to all columns subsequent to the defective half-column back to the left by one half-column during read operations. Similarly, programmable replacement circuit 120 uses the CC signals to shift comparand data corresponding to the defective half-column and all subsequent columns in main array 104 by one-half-column to the right during compare operations. In this manner, the defective half-column and all subsequent half-columns can be functionally replaced with corresponding adjacent half-columns, whereby the last half-column in main array 104 can be functionally replaced by a selected half of spare column 106.

For example, if the first or left half of the third column of main CAM array 104 contains one or more defects (e.g., such that the defects are all located within the first or left halves of CAM cells in the third column), a DHCA="000010.0" can be programmed into memory element 124 and provided to column address decoder 126. For this example, the DCA=000010 portion of DHCA indicates that the third column in main CAM array 104 contains defects, and the H=0 portion of DHCA indicates that the first or left half of the third column is defective.

For write operations, in response to DHCA, column decoder 126 asserts (e.g., to logic high) a first component of the third CC signal and all subsequent CC signals, and de-asserts (e.g., to logic low) the first 2 CC signals. The de-asserted state of the first two CC signals causes programmable replacement circuit 122 to not shift data originally intended for the first two columns of CAM cells in main CAM array 104, and the asserted states of the first component of the third CC signal and all subsequent CC signals causes programmable replacement circuit 122 to shift data originally intended for the first or left half of the third column and all subsequent half-columns by one-half-column to the right. Read/write circuit 114 receives the shifted data from programmable replacement circuit 122 and drives the corresponding shifted data onto corresponding bit line pairs BL and BL and onto one of the spare bit line pairs so that data is stored in non-defective portions (e.g., non-defective half-columns) of the CAM array 102. In this manner, data originally intended to be stored in columns preceding the defective half-column are stored therein, and data originally intended to be stored in the defective half of the third column and in all subsequent half-columns are instead stored in corresponding adjacent half-columns of CAM cells.

More specifically, for the above example, data originally intended to be stored in the first 2 columns are stored therein in a normal manner, data originally intended to be stored in the left half of the third column is instead stored in the right half of the third column, data originally intended to be stored in the right half of the third column is instead stored in the left half of the fourth column, data originally intended to be stored in the left half of the fourth column is instead stored in the right half of the fourth column, and so on, where data originally intended to be stored in the right half of the last column is instead stored in the left half of the spare column.

As described above, programmable replacement circuit 122 effectively shifts the defective half-column and all subsequent half-columns of main CAM array 104 by one half-column to the right of their original positions. In this manner, only one half of spare column 106 is used, thereby leaving the other half of spare column 106 available to replace another defective half-column (if any) in main CAM array 104. In contrast, conventional column redundancy techniques that replace an entire column of CAM cells having a defect therein with another entire column of CAM cells would essentially discard an otherwise usable half-column of CAM cells in main CAM array 104, thereby needlessly wasting valuable resources of the CAM device. Accordingly, the half-column redundancy technique of the present embodiments can more efficiently utilize spare columns of CAM cells, which in turn can achieve higher yields.

For read operations, the data word stored in a row selected by address decoder 108 is provided to read/write circuit 114, which in turn passes the data word to programmable replacement circuit 122. In response to the CC signals, programmable replacement circuit 122 re-orders (e.g., re-shifts) the bits of the data word for output to DBUS. Thus, continuing the example above, if programmable replacement circuit 122 shifts the data for the left half of the third column and all subsequent columns by one-half-column to the right during the write operation, then programmable replacement circuit 122 re-shifts the data from all columns subsequent to the left half of the third column by one-half-column back to the left during the read operation for output to DBUS.

For compare operations, a comparand word is provided to programmable replacement circuit 120 via CBUS. If there is a defective half-column in main CAM array 104, as indicated by the defective half-column address (DHCA) stored in memory element 124, programmable replacement circuit 120 shifts a portion of the comparand word that corresponds to the defective half-column and all subsequent columns in main CAM array 104 by one-half-column to the right, and passes all other portions of the comparand word (e.g., corresponding to half-columns prior to the defective half-column in the main CAM array 104) without change. More specifically, programmable replacement circuit 120 steers the comparand bits to comparand register 118, which in turn drives the comparand bits onto the comparand line pairs CL and $\overline{CL}$ and spare comparand line pair SCL and $\overline{SCL}$. In this manner, programmable replacement circuit 120 uses the CC signals to steer comparand data away from the defective half-column by shifting bits of the comparand word originally intended for the defective half-column and all subsequent columns by one half-column to the right, for example, in a manner similar to that employed by programmable replacement circuit 122 during write operations.

Figures 3A, 3B:
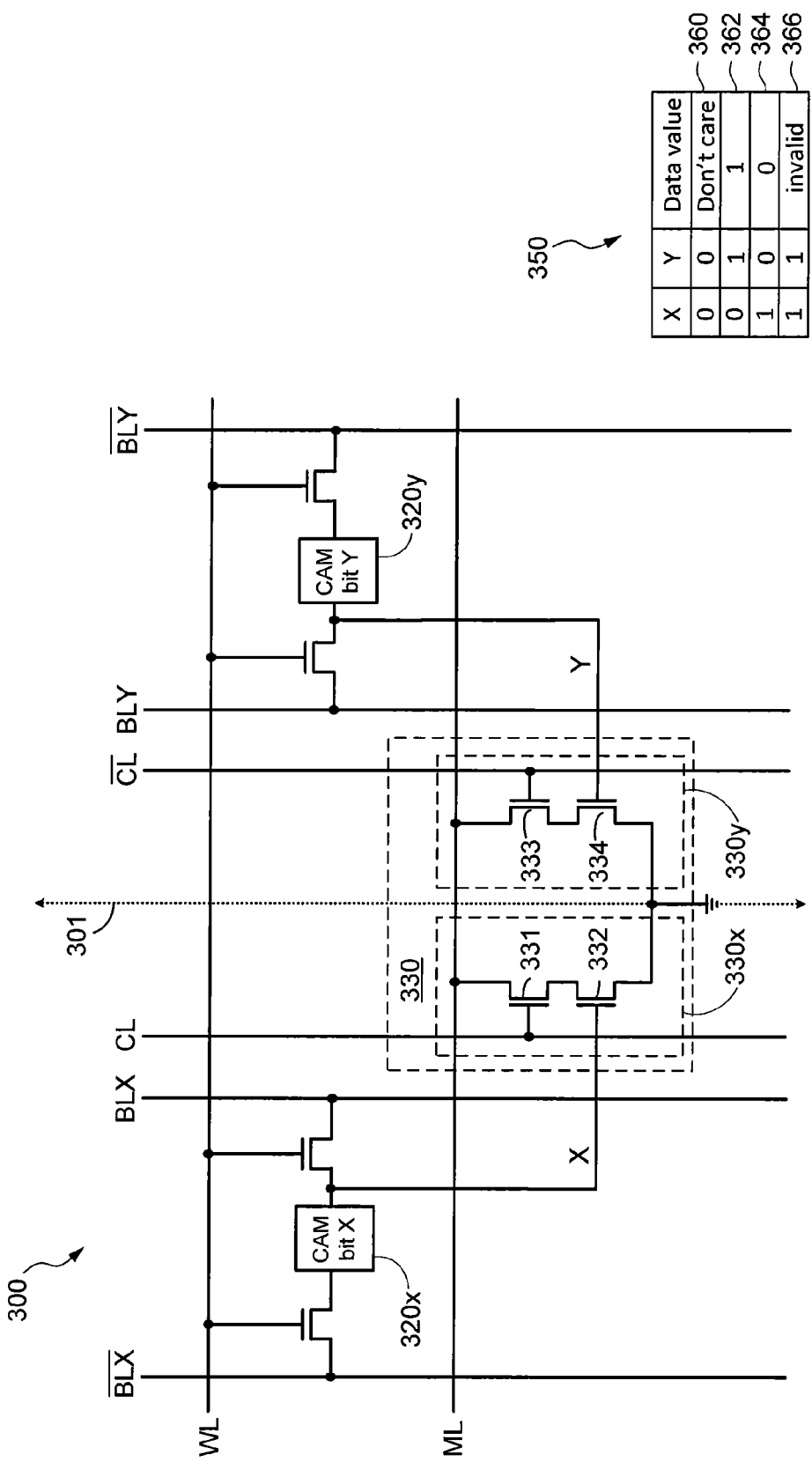
FIG. 3A is a circuit diagram of one embodiment of the CAM cells of FIG. 2.
FIG. 3B shows a truth table for data storage in the CAM cell of FIG. 3A.

FIG. 3A shows a CAM cell 300 that is one embodiment of CAM cell 202 of FIG. 2. CAM cell 300 is a quaternary CAM cell, which is also referred to herein as an XY CAM cell. CAM cell 300 includes two memory cells 320$x$ and 320$y$ coupled to a compare circuit 330. The first memory cell 320$x$ stores a first data bit X, and the second memory cell 320$y$ stores a second data bit Y. Compare circuit 330, which includes two half-compare circuits 330$x$ and 330$y$, selectively discharges the match line ML during compare operations between a comparand bit provided on comparand lines CL/$\overline{CL}$ and data stored in memory cells 320$x$ and 320$y$.

The two data bits X and Y can collectively store a data value having four possible states: "0," "1," "don't care," and a fourth state which can be left unused or can indicate an "invalid" state, as depicted in FIG. 3B. The logic "0" and "1" logic states correspond to the logic values represented, for example, by a conventional binary CAM cell. For each of these states, if the comparand data (e.g., provided to CAM cell 300 via complementary comparand lines CL and $\overline{CL}$) matches the data value stored in CAM cell 300, compare circuit 330 does not discharge the match line ML, which remains in a pre-charged logic high state to indicate a match condition. Conversely, if the comparand data does not match the data value stored in CAM cell 300, compare circuit 330 discharges match line ML low (e.g., toward ground potential) to indicate a mismatch condition. For the "don't care" state, the logic low states for X and Y maintain respective transistors 332 and 334 of compare circuit 330 in non-conductive states, thereby preventing compare circuit 330 from discharging match line ML. In this manner, data stored in CAM cell 300 is masked from the compare operation, thereby forcing a match condition for CAM cell 300, regardless of the comparand data. For the "invalid" state, the logic high states for X and Y maintain respective transistors 332 and 334 in conductive states so that during a compare operation in which one of the complementary comparand data bits provided on CL/$\overline{CL}$ will be logic high, compare circuit 330 will discharge match line ML low to indicate the mismatch state, regardless of the comparand data.

As depicted in FIG. 3A, CAM cell 300 is symmetrical about a vertical axis 301 collinear with the bit lines BL and comparand lines CL extending the length of a corresponding column of CAM array 102 (see also FIG. 1). More specifically, the two memory cells 320$x$ and 320$y$ are located on left and right sides, respectively, of axis 301, and the two half-compare circuits 330$x$ and 330$y$ are located on left and right sides, respectively, of axis 301. In some embodiments, the two memory cells 320$x$ and 320$y$ are identical and/or the two half-compare circuits 330$x$ and 330$y$ are identical (e.g., to within manufacturing tolerances). Further, half-compare circuit 330$x$ selectively discharges the match line ML in response to the X bit provided by memory cell 320$x$ and the comparand bit C provided on CL, and half-compare circuit 330$y$ selectively discharges the match line ML in response to the Y bit provided by memory cell 320$y$ and the complemented comparand bit $\overline{C}$ provided on $\overline{CL}$. Thus, the left and right halves of CAM cell 300 are not only symmetrical about vertical axis 301 but also can operate independently of one another. Accordingly, if only one half of CAM cell 300 is defective, then the other half of CAM cell 300 is still functional and can be used to independently compare one of the data bits (X or Y) with the corresponding comparand bit (C or $\overline{C}$). In this manner, the non-defective half of CAM cell 300 can be used in conjunction with one half of another similar CAM cell 300 (e.g., in another column of main CAM array 104 or in spare column 106) to implement a full XY CAM cell. The ability to use the non-defective half of a symmetrical CAM cell such as CAM cell 300 increases the efficiency with which limited CAM resources can be utilized, and therefore can also increase the yield of CAM devices that employ half-column redundancy techniques disclosed herein.

Figure 4A:
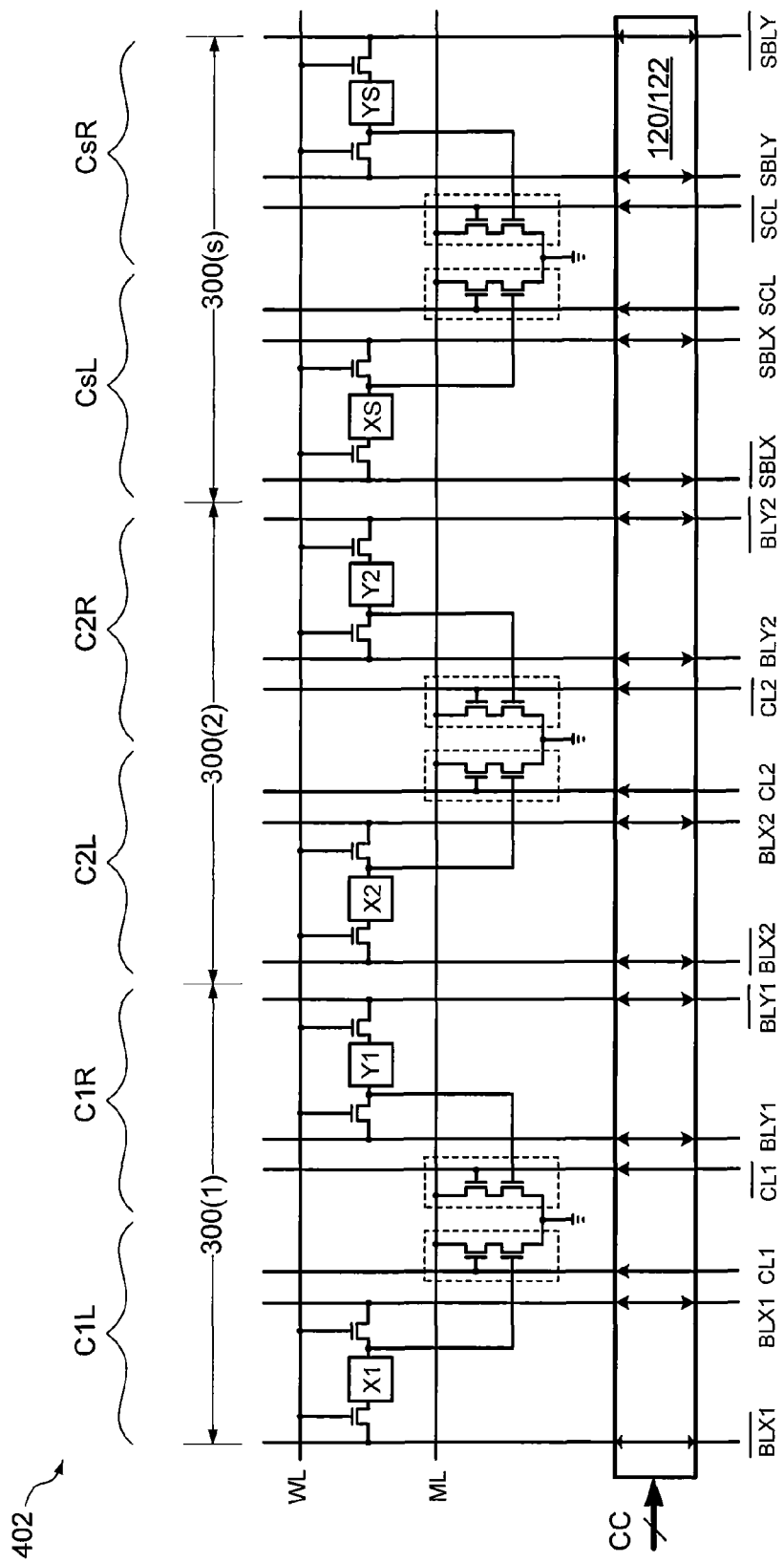
FIG. 4A is a simplified circuit diagram depicting an exemplary CAM array of the present embodiments that does not contain any defects.

FIG. 4A depicts a portion of a CAM array 402 that operates in a normal manner (e.g., without defects) according to the present embodiments. CAM array 402, which is one embodiment of CAM array 102 of FIG. 1, is shown to include two regular CAM cells 300(1)-300(2) and one spare CAM cell 300($s$), where regular CAM cells 300(1)-300(2) form part of two respective columns of main CAM array 104 and spare CAM cell 300($s$) forms a portion of spare column 106. Thus, although CAM array 402 is shown to include only one row that includes 2 regular CAM cells 300(1)-300(2) and one spare CAM cell 300(s) for simplicity, it is to be understood that for actual embodiments, CAM array 402 can include any number of rows and columns of regular CAM cells 300, and any number of rows and columns of spare CAM cells 300. Further, although CAM array 402 is shown to include CAM cells 300 for purposes of discussion herein, for other embodiments, CAM array 402 can include other types of symmetrical CAM cells.

As discussed above, each CAM cell 300 stores two data bits X and Y that collectively represent a data value having four possible states, where the X bit is stored in the left half of CAM cell 300 and the Y bit is stored in the right half of CAM cell 300. Thus, for the non-defective CAM array 402 depicted in FIG. 4A, the left half of CAM cell 300(1) stores X1, the right half of CAM cell 300(1) stores Y1, the left half of CAM cell 300(2) stores X2, the right half of CAM cell 300(1) stores Y2, and the spare CAM cell 300(s) is not used. Thus, the spare CAM cell 300(s) does not participate in compare operations for the non-defective CAM array 402 of FIG. 4A. For some embodiments, spare CAM cell 300(s) can be masked by asserting both of its corresponding comparand lines CLS and $\overline{CLS}$ to a predetermined logic state (e.g., logic low) that prevents spare CAM cell 300(s) from discharging the match line ML. For other embodiments, spare CAM cell 300(s) can be masked from the compare operation by storing the don't care state (X=0 and Y=0) to prevent spare CAM cell 300(s) from discharging the match line ML.

Note that the first or left half of the first column is denoted as C1L, the second or right half of the first column is denoted as C1R, the first or left half of the second column is denoted as C2L, the second or right half of the second column is denoted as C2R, the first or left half of the spare column is denoted as CsL, and the second or right half of the spare column is denoted as CsR.

Because there are no defects in CAM array 402 of FIG. 4A, programmable replacement circuit 122 does not alter the data written to or read from the array, and programmable replacement circuit 120 does not alter the comparand data provided to array 402 during compare operations. Accordingly, programmable replacement circuit 122 is depicted in FIG. 4A as providing data to the originally intended columns of CAM cells. For example, programmable replacement circuit 122 provides data intended for CAM cell 300(1) to CAM cell 300(1) in a normal manner, provides data intended for CAM cell 300(2) to CAM cell 300(2) in a normal manner, and does not steer any data to spare CAM cell 300(s). Similarly, programmable replacement circuit 120 provides comparand data intended for CAM cell 300(1) to CAM cell 300(1) in a normal manner, provides comparand data intended for CAM cell 300(2) to CAM cell 300(2) in a normal manner, and does not steer any comparand data to spare CAM cell 300(s).

Figure 4B:
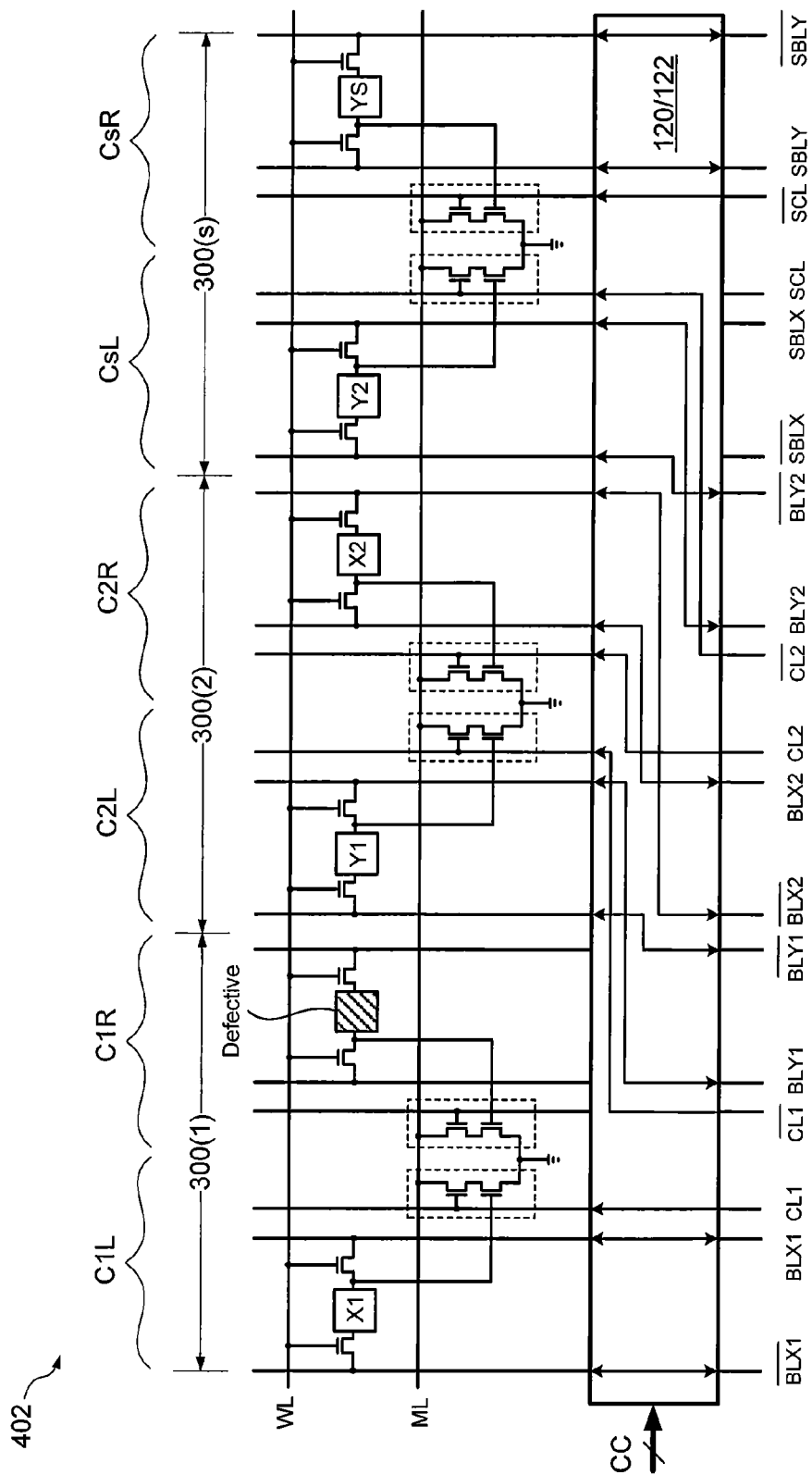
FIG. 4B is a simplified circuit diagram depicting an exemplary CAM array of the present embodiments that contains defects.

FIG. 4B shows the same portion of CAM array 402 as FIG. 4A, but depicts a defect in the right half of the first column (C1R). More specifically, the Y memory cell located in the right half of CAM cell 300(1) is shown to be defective in FIG. 4B. In response thereto, a defective half-column address (DHCA) indicating that the right half of CAM cell 300(1) contains a defect is generated and stored in memory element 124 (see also FIG. 1). The memory element 124 outputs the DHCA to column address decoder 126, which in turn generates the corresponding column control (CC) signals. In response to the CC signals, programmable replacement circuits 120 and 122 (shown collectively as circuit 120/122 in FIG. 4B for simplicity) shift data access for the defective half-column C1R and all subsequent columns C2L and C2R in CAM array 402 by one half-column to the right for write and compare operations.

More specifically, programmable replacement circuits 120 and 122 shift the Y1 data from the right half of CAM cell 300(1) to the left half of CAM cell 300(2), shift the X2 data from the left half of CAM cell 300(2) to the right half of CAM cell 300(2), and shift the Y2 data from the right half of CAM cell 300(2) to the left half of spare CAM cell 300(s), as depicted in FIG. 4B. In this manner, the defective half-column C1R is functionally replaced by half-column C2L, half-column C2L is functionally replaced by half-column C2R, and half-column C2R is functionally replaced by half-column CsL. Note that the X1 data associated with the left half of CAM cell 300(1), which is prior to the defective half-column, is not steered to another half-column by programmable replacement circuit 122. Thus, after the half-column replacement is performed by programmable replacement circuits 120 and 122, the left half of CAM cell 300(1) and the left half of CAM cell 300(2) collectively operate as an XY CAM cell that stores a first data value D1 represented by bits X1 and Y1, and the right half of CAM cell 300(2) and the left half of spare CAM cell 300(s) collectively operate as an XY CAM cell that stores the second data value D2 represented by bits X2 and Y2, as depicted in FIG. 4B. In this manner, CAM array 402 can function (and can thus be sold to consumers) as a fully operational (e.g., non-defective) CAM array.

Moreover, because the half-column redundancy techniques disclosed herein can functionally replace half-columns rather than replace only entire columns, the right half of spare CAM cell 300(s) and the corresponding right half-column CsR remain unused, and are therefore available for functionally replacing another defective half-column in the CAM array (e.g., that may be subsequently detected). In this manner, half-column redundancy techniques in accordance with the present embodiments can increase yield compared to conventional redundancy techniques that replace an entire column of CAM cells with another entire column of CAM cells, regardless of where in the column the defects are located.

Figure 5A:
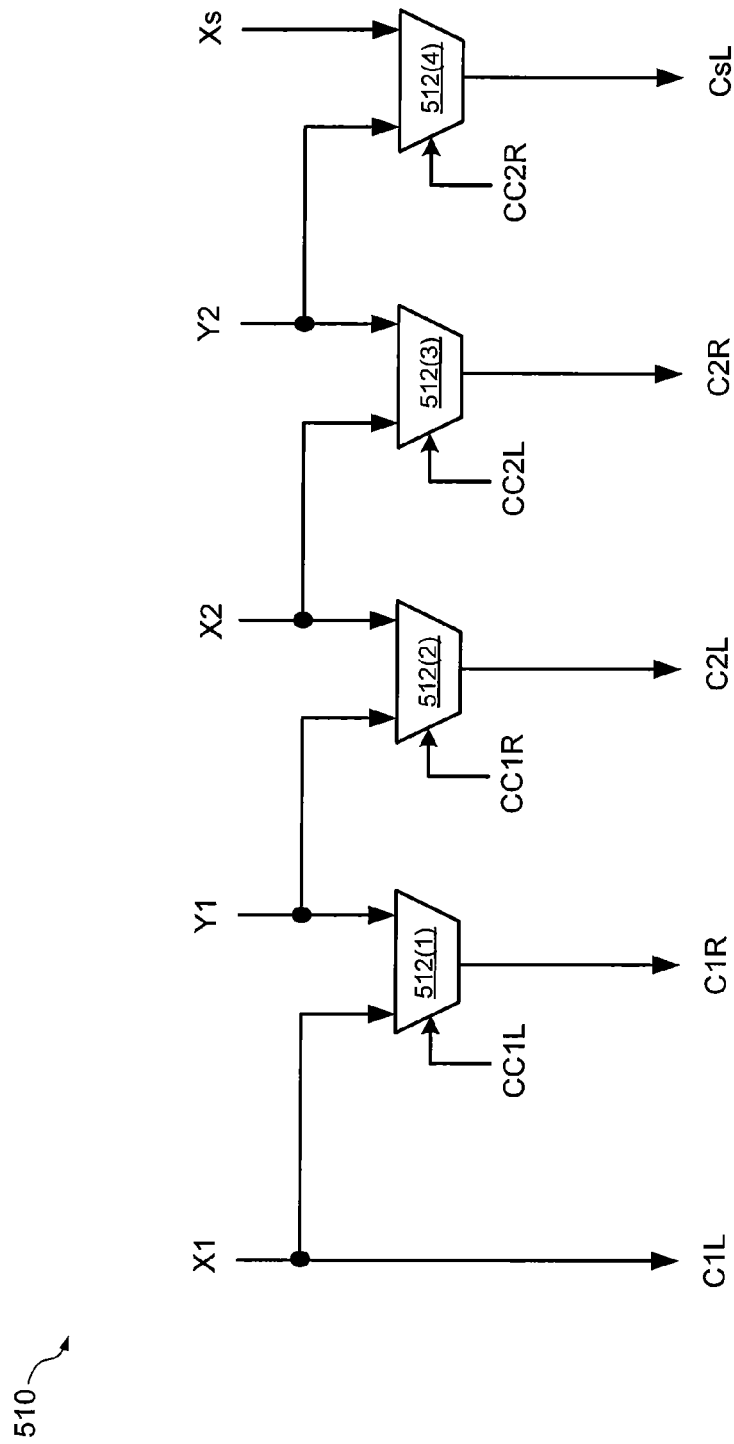
FIG. 5A is a simplified block diagram of one portion of the programmable replacement circuit of FIG. 1 in accordance with some embodiments.

As mentioned above, programmable replacement circuits 120 and 122 can be any well-known switching logic such as, for example, a crossbar logic circuit, a switch matrix, translation logic, data filter, or mapping circuit that steers data to and from selected half-columns of CAM array 102 in response to one or more column control (CC) signals. For example, FIG. 5A shows an exemplary circuit configuration 510 for one embodiment of programmable replacement circuit 122 of FIG. 1 used for steering data access during write operations of the exemplary CAM array 402 depicted in FIGS. 4A and 4B. Programmable replacement circuit 510 includes a plurality of multiplexers (MUXes) 512(1)-512(4), each of which includes inputs to receive a corresponding data bit and a previous data bit, a control terminal to receive a corresponding CC signal, and an output coupled to a corresponding half-column of the CAM array. More specifically, the X1 bit is provided to the first half-column C1L of the CAM array and to a first input of MUX 512(1), which includes a second input to receive the Y1 bit, a control terminal to receive CC1L, and an output coupled to the second half-column C1R of CAM array 402. The Y1 data bit is also provided to a first input of MUX 512(2), which includes a second input to receive the X2 data bit, a control terminal to receive CC1R, and an output coupled to the third half-column C2L of CAM array 402. The X2 data bit is also provided to a first input of MUX 512(3), which includes a second input to receive the Y2 data bit, a control terminal to receive CC2L, and an output coupled to the fourth half-column C2R of CAM array 402. The Y2 data bit is also provided to a first input of MUX 512(4), which includes a second input to receive a spare data bit Xs, a control terminal to receive CC2R, and an output coupled to the first half of the spare column.

Referring also to FIG. 1, if there is not a defective column in the main CAM array, the CC signals are de-asserted (e.g., to logic low), and each MUX 512 passes the corresponding data bit from its second input to the corresponding column. For example, X1 is passed to the left half-column C1L, MUX 512(1) passes Y1 to the half-column C1R in response to a de-asserted CC1L, MUX 512(2) passes X2 to half-column C2L in response to a de-asserted CC1R, and MUX 512(3) passes Y2 to half-column C2R in response to a de-asserted CC2L.

If there is a defective half-column in the main CAM array 104, programmable replacement circuit 510 shifts data associated with the defective half-column and all subsequent columns by one half-column to the right. For example, if the second half-column C1R is defective (as depicted in FIG. 4B), CC1L is de-asserted, and CC1R and all subsequent CC signals are asserted (e.g., to logic high). In response thereto, MUX 512(1) does not steer X1 to half-column C1R, MUX 512(2) steers Y1 to half-column C2L, MUX 512(3) steers X2 to half-column C2R, and MUX 512(4) steers Y2 to the first spare half-column CsL.

Note that circuit configurations similar to that shown in FIG. 5A can be used to form programmable replacement circuit 120 to steer comparand data away from defective half-columns and into non-defective half-columns during compare operations.

Figure 5B:
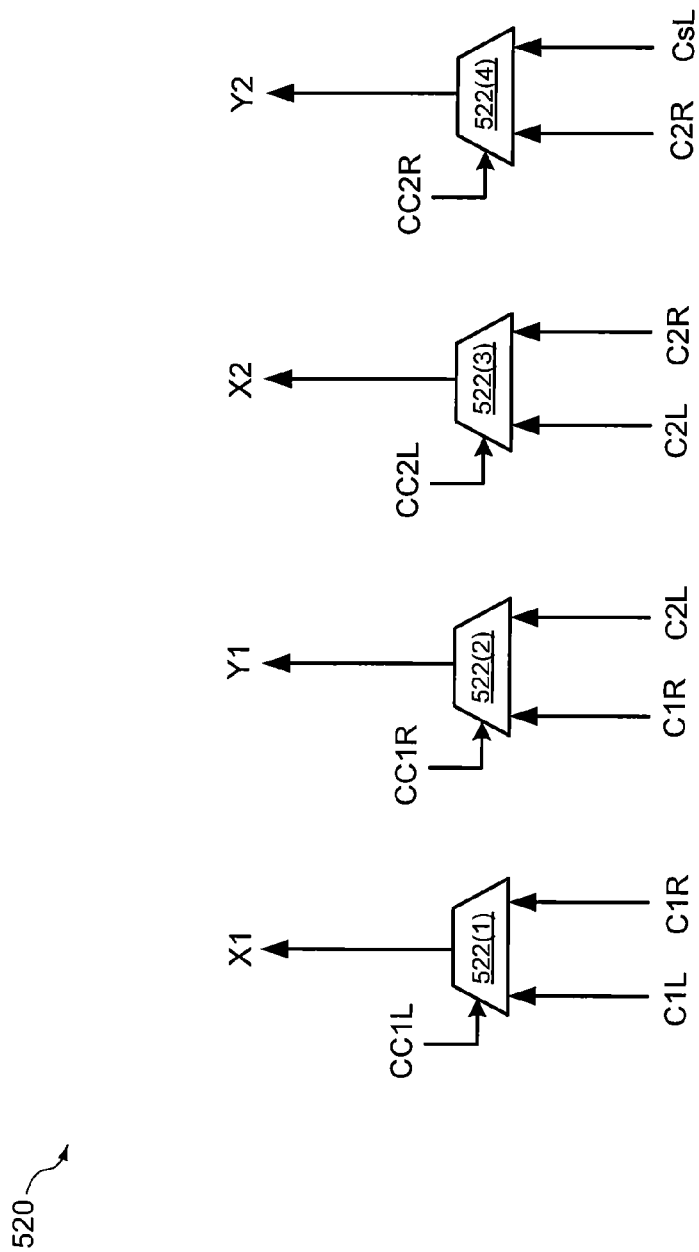
FIG. 5B is a simplified block diagram of another portion of the programmable replacement circuit of FIG. 1 in accordance with some embodiments.

FIG. 5B shows an exemplary circuit configuration 520 for one embodiment of programmable replacement circuit 122 of FIG. 1 used for steering data access during read operations of the exemplary CAM array 402 depicted in FIGS. 4A and 4B. Programmable replacement circuit 520 includes a plurality of MUXes 522(1)-522(4), each of which includes inputs coupled to corresponding adjacent half-columns of CAM array 402, a control terminal to receive a corresponding CC signal, and an output to provide a corresponding data bit. More specifically, MUX 522(1) includes inputs coupled to the first and second half-columns C1L and C1R, a control terminal to receive CC1L, and an output to provide the X1 data bit. MUX 522(2) includes inputs coupled to the second and third half-columns C1R and C2L, a control terminal to receive CC1R, and an output to provide the Y1 data bit. MUX 522(3) includes inputs coupled to the third and fourth half-columns C2L and C2R, a control terminal to receive CC2L, and an output to provide the X2 data bit. MUX 522(4) includes inputs coupled to the fourth half-column C2R and the first spare half-column CsL, a control terminal to receive CC2R, and an output to provide the Y2 data bit.

If there is not a defective column in the main CAM array 104, the CC signals are de-asserted (e.g., to logic low), and each MUX 522 outputs data from the corresponding column. For example, MUX 522(1) outputs data from half-column C1L as X1 in response to a de-asserted CC1L, MUX 522(2) outputs data from half-column C1R as Y1 in response to a de-asserted CC1R, MUX 522(3) outputs data from the half-column C2L as X2 in response to a de-asserted CC2L, and MUX 522(4) outputs data from half-column C2R as Y2 in response to a de-asserted CC2R.

If there is a defective column in the main CAM array 104, programmable replacement circuit 520 shifts data subsequent to the defective half-column by one half-column to the left when reading from the CAM array. For example, if the second half-column C1R is defective (as depicted in FIG. 4B), CC1R and all subsequent CC signals are asserted (e.g., to logic high). In response thereto, MUX 522(2) steers data from the third half-column C2L as Y1, MUX 522(3) steers data from the fourth half-column C2R as X2, and MUX 522(4) steers data from the first spare half-column CsL as Y2. Note that CC1L is de-asserted (e.g., to logic low), and therefore MUX 522(1) provides data from the first half-column C1L as X1.

Referring again to FIG. 1, for other embodiments, instead of shifting data associated with the defective half-column and all subsequent columns by one-half-column, programmable replacement circuits 120 and 122 can steer data access just for the defective half-column of CAM cells in main CAM array 104 to one half of spare column 106. Thus, for write operations, programmable replacement circuit 122 can steer data originally intended for the defective half-column to a selected half of spare column 106. For read operations, programmable replacement circuit 122 can steer data received from the selected half of spare column 106 back into its original position for output onto DBUS. For compare operations, programmable replacement circuit 120 can steer comparand data corresponding to the defective half-column to the selected half of the spare column for comparison with data stored therein.

While particular embodiments have been shown and described, it will be obvious to those skilled in the art that changes and modifications can be made without departing from this disclosure in its broader aspects and, therefore, the appended claims are to encompass within their scope all such changes and modifications as fall within the true spirit and scope of this disclosure.

Further, it should be noted that the various circuits disclosed herein can be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions can be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions can be embodied include, but are not limited to, non-volatile storage media in various forms (e.g., optical, magnetic or semiconductor storage media).

What is claimed is:

1. A content addressable memory (CAM) device having half-column redundancy, comprising:
   an array including a plurality of regular columns of CAM cells and a spare column of CAM cells, wherein each column comprises first and second halves; and
   a programmable replacement circuit, coupled to the CAM array, configured to functionally replace a defective half of a first column with one half of a selected column without replacing the other half of the first column.

2. The CAM device of claim 1, wherein the other half of the first column is to remain available to participate in compare operations after the defective half of the first column is functionally replaced.

3. The CAM device of claim 1, wherein the first column is the selected column.

4. The CAM device of claim 1, wherein the first column is not the selected column.

5. The CAM device of claim 1, wherein the first column and the selected column are adjacent to each other.

6. The CAM device of claim 1, wherein the selected column is the spare column.

7. The CAM device of claim 1, wherein the programmable replacement circuit is further configured to functionally replace each half-column subsequent to the defective half-column with a corresponding adjacent half-column.

8. The CAM device of claim 7, wherein at least one half of a last regular column is configured to be functionally replaced by a selected half of the spare column.

9. The CAM device of claim 1, further comprising:
a column decoder configured to generate a plurality of column control signals in response to a defective half-column address, wherein a respective column control signal indicates whether half of a corresponding column of CAM cells is defective.

10. The CAM device of claim 9, wherein the defective half-column address includes a first portion indicating a corresponding column that contains a defect, and includes a second portion indicating which half of the corresponding column contains the defect.

11. The CAM device of claim 9, wherein the programmable replacement circuit is further configured to steer data from the defective half of the first column to the one half of the selected column in response to the column control signals.

12. The CAM device of claim 1, wherein the programmable replacement circuit is further configured to drive a comparand line of the defective half of the first column to a predetermined logic state to prevent the defective half of the first column from participating in compare operations in the CAM device.

13. The CAM device of claim 1, wherein a respective CAM cell includes first and second halves that are symmetrical about a vertical axis of the corresponding column.

14. The CAM device of claim 13, wherein the respective CAM cell comprises a quaternary CAM cell.

15. The CAM device of claim 13, wherein respective CAM cells located within the first column are to remain enabled when first halves of the respective CAM cells located within the first column are disabled.

16. The CAM device of claim 15, wherein the second halves of the respective CAM cells located within the first column functionally replace the first halves of the respective CAM cells located within the first column.

17. A content addressable memory (CAM) device having half-column redundancy, comprising:
an array including a plurality of columns of CAM cells, wherein each column comprises left and right halves; and
a programmable replacement circuit, coupled to the array, configured to functionally replace a defective half-column of a first column with a non-defective half-column without replacing the other half of the first column.

18. The CAM device of claim 17, wherein a respective CAM cell comprises a quaternary CAM cell.

19. The CAM device of claim 17, wherein a respective CAM cell includes left and right halves that are symmetrical about a vertical axis of the corresponding column.

20. The CAM device of claim 19, wherein halves of CAM cells associated with the defective half-column are functionally replaced by halves of CAM cells associated with the non-defective half-column.

21. The CAM device of claim 19, wherein halves of CAM cells associated with the defective half-column are disabled, and remaining halves of the CAM cells are not disabled.

22. The CAM device of claim 17, wherein the defective half-column is adjacent to the non-defective half-column.

23. The CAM device of claim 17, wherein the defective half-column and the non-defective half-column together form a single column of the array.

24. The CAM device of claim 17, wherein the non-defective half-column forms part of a spare column of CAM cells.

25. The CAM device of claim 17, wherein the programmable replacement circuit is further configured to functionally replace each half-column subsequent to the defective half-column with a corresponding adjacent half-column.

26. The CAM device of claim 17, further comprising:
a column decoder configured to generate a plurality of column control signals in response to a defective half-column address, wherein a respective column control signal indicates whether half of a corresponding column of CAM cells is defective.

27. The CAM device of claim 26, wherein the programmable replacement circuit is further configured to steer data from the defective half-column to the non-defective half-column in response to the column control signals.

28. The CAM device of claim 17, wherein the programmable replacement circuit is further configured to drive a comparand line of the defective half-column to a predetermined logic state to prevent the defective half-column from participating in compare operations in the CAM device.

* * * * *